US006356148B1

(12) United States Patent
    Marble

(10) Patent No.: US 6,356,148 B1
(45) Date of Patent: Mar. 12, 2002

(54) SYSTEMS AND METHODS FOR ENHANCING CHARGE TRANSFER AMPLIFIER GAIN

(75) Inventor: William J. Marble, Provo, UT (US)

(73) Assignee: AMI Semiconductor, Inc., Pocatello, ID (US)

( * ) Notice: Subject to any disclaimer, the term of this patent is extended or adjusted under 35 U.S.C. 154(b) by 42 days.

(21) Appl. No.: 09/620,277

(22) Filed: Jul. 18, 2000

Related U.S. Application Data

(63) Continuation-in-part of application No. 09/451,562, filed on Nov. 30, 1999.

(51) Int. Cl.$^7$ ............................................... H03F 1/02

(52) U.S. Cl. ........................................... 330/9; 327/124

(58) Field of Search .............................. 330/9; 327/124, 327/284

(56) References Cited

U.S. PATENT DOCUMENTS 4,661,929 A * 4/1987 Aoki et al. .................. 365/189
6,150,851 A * 11/2000 Ohmi et al. ................... 327/91

OTHER PUBLICATIONS

Brandt, Brian P. et al., "A 75–m W, 10–b, 20–MSPS CMOS Subranging ADC with 9.5 Effective Bits at Nyquist" *IEEE Journal of Solid–State Circuits*, vol. 34, No. 12, Dec. 1999, pp. 1788–1795.

Chang, Dong–Young, et al. "Design Techniques for a Low–Power Low–Cost CMOS A/D Converter" *IEEE Journal of Solid–State Circuits*, vol. 33, No. 8, Aug. 1998, pp. 1244–1248.

Cusinato, P., et al. "Analysis of the Behavior of a Dynamic Latch Comparator" *IEEE Transactions on Circuits and Systems—I: Fundamental Theory and Applications*, vol. 45, No. 3, Mar. 1998, pp. 294–298.

Dingwall, Adrew G. F., et al. "An 8–MHz CMOS Subranging 8–Bit A/D Converter" *IEEE Journal of Solid–State Circuits*, vol. SC–20, No. 6, Dec. 1985, pp. 1138–1143.

Ito, Masao, et al. "A 10 bit 20 MS/s 3 V Supply CMOS A/D Converter" *IEEE Journal of Solid–State Circuits*, vol. 29, No. 12, Dec. 1994, pp. 1531–1536.

Kawashima, Shoichiro, et al. "A Charge–Transfer Amplifier and an Encoded–Bus Architecture for Low–Power SRAM's" *IEEE Journal of Solid–State Circuits*, vol. 33, No. 5, May 1998, pp. 793–799.

Kotani, Koji, et al. "CMOS Charge–Transfer Preamplifier for Offset–Fluctuation Cancellation in Low–Power A/D Converters" *IEEE Journal of Solid–State Circuits*, vol. 33, No. 5, May 1998, pp. 762–768.

(List continued on next page.)

*Primary Examiner*—Robert Pascal
*Assistant Examiner*—Henry Choe
(74) *Attorney, Agent, or Firm*—Workman, Nydegger & Seeley

(57) ABSTRACT

A charge transfer amplifier includes a first stage charge transfer amplifier coupled to a positive capacitive feedback mechanism. The positive capacitive feedback mechanism is attached to the output terminal of a first stage charge transfer amplifier. This reduces the capacitance viewed at the output terminal of the first stage charge transfer capacitor thus increasing the overall gain of the charge transfer amplifier. The positive capacitive feedback mechanism includes a second stage amplifier having an output terminal capacitively coupled back to the output terminal of the first stage charge transfer amplifier. The coupling of the positive capacitive feedback mechanism to the charge transfer amplifier allows for enhanced amplifier gain while still retaining the beneficial characteristics of charge transfer amplifiers generally.

18 Claims, 9 Drawing Sheets-

OTHER PUBLICATIONS

Kotani, Koji, et al. "CMOS Charge–Transfer Preamplifier for Offset–Fluctuation Cancellation in Low–Power, High–Accuracy Comparators" *1997 Symposium on VLSI Circuits Digest of Technical Papers*, pp. 21–22.

Kotani, Koji, et al. "Feedback Charge–Transfer Comparator with Zero Static Power" *IEEE International Solid State Circuits Conference*, Feb. 1999, pp. 328–329.

Kusumoto, Keiichi, et al. "A 10–b 20–MHz 30–m W Pipelined Interpolating CMOS ADC" *IEEE Journal of Solid–State Circuits*, vol. 28, No. 12, Dec. 1993, pp. 1200–1206.

Marble, William J., et al. "A Differential Charge Transfer Amplifier for Low–Power Sensing and Instrumentation" *IEEE Custom Integrated Circuits Conference*, May 2000, In Review.

McCreary, James L., et al. "All–MOS Charge Redistribution Analog–to–Digital Conversion Techniques—Part I" *IEEE Journal of Solid–State Circuits*, vol. SC–10, No. 6, Dec. 1975, pp. 371–379.

Ploeg, Hendrik van der. "A 3.3–V, 10–b, 25–MSample/s Two–Step ADC in 0.35–$\mu$m CMOS" *IEEE Journal of Solid–State Circuits*, vol. 34, No. 12, Dec. 1999, pp. 1803–1811.

Shieh, Je–Hurn, et al. "Measurement and Analysis of Charge Injection in MOS Analog Switches" *IEEE Journal of Solid–State Circuits*, vol. SC–22, No. 2, Apr. 1987, pp. 277–281.

Tsukude, Masaki, et al. "A 1.2 to 3.3–V Wide Voltage–Range/Low–Power DRAM with a Charge–Transfer Pre-sensing Scheme" *IEEE Journal of Solid–State Circuits*, vol. 32, No. 11, Nov. 1997, pp. 1721–1727.

* cited by examiner

SYSTEMS AND METHODS FOR ENHANCING CHARGE TRANSFER AMPLIFIER GAIN

CROSS-REFERENCE TO RELATED APPLICATIONS

The present application is a continuation-in-part of U.S. patent application Ser. No. 09/451,562, filed Nov. 30, 1999, which is incorporated herein by reference in its entirety.

BACKGROUND OF THE INVENTION

1. The Field of the Invention

The present invention relates to systems and methods for amplifying electrical signals. More specifically, the present invention relates to systems and methods for enhancing charge transfer amplifier gain.

2. The Prior State of the Art

There are many circuits and methods conventionally available for amplifying an electrical signal. One type of amplifier is called a charge transfer amplifier. Charge transfer amplifiers operate on the principle of capacitive charge sharing. Voltage amplification is achieved by transferring a specific amount of charge between appropriately sized capacitors through an active device.

FIG. 1 illustrates a charge transfer amplifier 100 that utilizes an nMOS transistor N1 to transfer charge between capacitors CT and CO. The operation of the nMOS charge transfer amplifier 100 will now be described in order to illustrate the basic principle of charge transfer amplification.

The nMOS charge transfer amplifier 100 operates in a cycle of three phases including a reset phase, a precharge phase, and an amplify phase. FIG. 2 is a signal timing diagram for two input signals $S_1$ and $S_2$ with respect to the cycle phase that the nMOS charge transfer amplifier 100 is operating in whether that phase be (a) the reset phase, (b) the precharge phase or (c) the amplify phase. The two input signals $S_1$ and $S_2$ control corresponding switches S1 and S2 of FIG. 1. Switch !S1 corresponds to the inverse phase of the input signal $S_1$.

The cycle begins with the (a) reset phase in which both input signals signal $S_1$ and $S_2$ are high indicating that switches S1 and S2 are closed and that switch !S1 is open. Since the switch S1 is closed, the upper terminal of capacitor CT (i.e., node A) is discharged through the switch S1 to voltage Vss. Since the switch S2 is closed, the upper terminal of capacitor CO (i.e., node B is charged to a voltage $V_{PR}$. The open switch !S1 prevents static current from flowing through the nMOS transistor N1.

After the reset phase is the (b) precharge phase in which the signal $S_1$ is low indicating that switch S1 is open and the switch !S1 is closed, and in which the signal $S_2$ is high indicating that the switch S2 remains closed. Thus, the upper terminal of the capacitor CO (i.e., node B) remains charged at the precharge voltage $V_{PR}$. This precharge voltage $V_{PR}$ is high enough that current flows from node B to the capacitor CT (and node A) through the nMOS transistor N1 and the switch !S1. For example, if the precharge voltage $V_{PR}$ is at least equal to the input voltage $V_{IN}$ at the gate of the nMOS transistor N1, then the discharge continues until the voltage at the capacitor CT increases to be equal to the input voltage $V_{IN}$ minus the threshold voltage (hereinafter "$V_{TN}$") of the nMOS transistor N1. At that point, the nMOS transistor N1 enters the cutoff region and current flow to the capacitor $C_T$ substantially ceases. Thus, at the end of the precharge phase, the capacitor CO ideally has a voltage of $V_{PR}$ while the capacitor CT has a voltage of $V_{IN} - V_{TN}$.

After the precharge phase is the (c) amplify phase in which both signals $S_1$ and $S_2$ are low indicating that both switches S1 and S2 are open. During the amplify phase, an incrementally positive input voltage change $\Delta V_{IN}$ at the gate of the nMOS transistor N1 will cause the nMOS transistor N1 to turn on thereby allowing current to flow through the nMOS transistor N1 until the nMOS transistor is again cutoff. For small incrementally positive voltage changes $\Delta V_{IN}$, the nMOS transistor N1 will cutoff when the voltage on the upper terminal of the capacitor CT (i.e., node A) increases by the incrementally positive voltage change $\Delta V_{IN}$. The amount of charge transferred to the capacitor CT in order to produce this effect is equal to the incrementally positive voltage change $\Delta V_{IN}$ times the capacitance $C_T$ of the capacitor CT.

Since the charge $\Delta V_{IN} \times C_T$ transferred to the capacitor CT came from node B through transistor N1, the charge $\Delta V_{IN} \times C_T$ was drawn from the capacitor CO. Thus, the voltage at the capacitor CO and the output voltage $V_{OUT}$ will change by $\Delta V_{IN} \times (C_T/C_O)$. If the capacitance $C_T$ is greater than the capacitance $C_O$, amplification occurs.

One advantage of the nMOS charge transfer amplifier 100 is that the voltage gain and power consumption maybe controlled by setting the capacitance of the capacitors CO and CT as well as by setting the capacitance ratio $C_T/C_O$. Another advantage of charge transfer amplifiers in general is that the circuit performance is generally unaffected by the absolute values of the supply voltage Vss and Vdd as long as these voltages permit proper biasing during the reset and precharge phases. In other words, charge transfer amplifiers have high supply voltage scalability in that no changes are needed for a charge transfer amplifier to operate using a wide range of supply voltages Vss and Vdd.

Although the nMOS charge transfer amplifier 100 has these advantages, amplification only occurs in the nMOS charge transfer amplifier 100 if the input gate voltage change $\Delta V_{IN}$ is positive. A negative gate voltage change $\Delta V_{IN}$ would only cause the nMOS transistor N1 to enter deeper into the cutoff region. Thus, charge transfer between node A and node B would be stifled thereby preventing amplification.

FIG. 3 shows a conventional CMOS charge transfer amplifier 300 that amplifies using positive input voltage changes $\Delta V_{IN}$ as well as negative input voltage changes $\Delta V_{IN}$. The CMOS charge transfer amplifier 300 includes the nMOS charge transfer amplifier 100 described above. For clarity, the nMOS charge transfer amplifier 100 is shown in FIG. 3 as being enclosed by a dotted box.

The CMOS charge transfer amplifier 300 also includes a partially overlapping pMOS charge transfer amplifier 301 which is shown in FIG. 3 enclosed by a dashed box for clarity. The pMOS charge transfer amplifier 301 shares the voltage input line 302, the voltage output line 303 and the precharge line 304 with the nMOS charge transfer amplifier 100. The pMOS charge transfer amplifier 301 is structured similar to the nMOS charge transfer amplifier 100 except that the pMOS charge transfer amplifier 301 uses a pMOS transistor P1 instead of an nMOS transistor N1 for transferring charge between capacitors. Also, node A' of the pMOS charge transfer amplifier 301 is reset to a high voltage Vdd instead of the low voltage Vss and is capacitively coupled to the high voltage Vdd instead of the low voltage Vss.

The general operation of the pMOS charge transfer amplifier 301 for negative input voltage changes $\Delta V_{IN}$ is similar to the operation of the nMOS charge transfer amplifier 100 for positive voltage changes $\Delta V_{IN}$ Thus, the input signals $S_1$ and $S_2$ of FIG. 2 are used in the operation of the CMOS charge transfer amplifier 300. Due to the complementary nature of the nMOS charge transfer amplifier 100 and the pMOS charge transfer amplifier 301, the CMOS charge transfer amplifier 300 amplifies for both positive and negative input voltage changes $\Delta V_{IN}$.

The CMOS charge transfer amplifier 300 is advantageous in that it consumes no static current, capitalizes on parasitic capacitors, is memory less, operates over a wide voltage supply range, produces little noise, is insensitive to threshold voltage fluctuations, and comprises relatively few devices. However, it would represent an advancement in the art to create a system and method in which the gain of the charge transfer amplifier is enhanced without giving up any of the advantages inherent in the charge transfer amplifier.

SUMMARY AND OBJECTS OF THE INVENTION

The foregoing problems in the prior state of the art have been successfully overcome by the present invention, which is directed to an enhanced gain amplifier for use with charge transfer amplifiers. A positive capacitive feedback mechanism is attached from the output terminal to an intermediate terminal of the charge transfer amplifier. This reduces the capacitance viewed at the intermediate terminal of the charge transfer amplifier thus increasing the overall gain of the charge transfer amplifier. The positive capacitive feedback mechanism includes a second stage amplifier having an output terminal capacitively coupled back to the output terminal of the first stage charge transfer amplifier. The coupling of the positive capacitive feedback mechanism to the charge transfer amplifier allows for enhanced amplifier gain while still retaining the beneficial characteristics of the charge transfer amplifier.

In one embodiment, the first stage charge transfer amplifier is a differential mode charge transfer amplifier. The second stage amplifier may also be a differential mode charge transfer amplifier with no input coupling portion required. The positive capacitive feedback occurs by capacitively coupling one output terminal of the second stage differential mode charge transfer amplifier to an output terminal of the first stage differential mode charge transfer amplifier. Similarly, the other output terminal of the second stage differential mode charge transfer amplifier is capacitively coupled to the other output terminal of the first stage differential mode charge transfer amplifier. This positive capacitive feedback mechanism increases the gain of the first differential mode charge transfer amplifier. This additional gain is fed to the second stage differential mode charge transfer amplifier thereby improving the gain of the entire cascaded differential mode charge transfer amplifiers. In one embodiment, the feedback capacitors are structured similar to transistors within the second stage differential mode charge transfer amplifiers to improve the performance of the cascaded differential mode charge transfer amplifiers over a wide range of temperatures, bias conditions and threshold voltages.

Additional advantages of the invention will be set forth in the description which follows, and in part will be obvious from the description, or may be learned by the practice of the invention. The objects and advantages of the invention may be realized and obtained by means of the instruments and combinations particularly pointed out in the appended claims. These and other objects and features of the present invention will become more fully apparent from the following description and appended claims, or maybe learned by the practice of the invention as set forth hereinafter.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE PREFERRED EMBODIMENTS

The invention is described below by using diagrams to illustrate either the structure or processing of embodiments used to implement the circuits and methods of the present invention. Using the diagrams in this manner to present the invention should not be construed as limiting of the scope of the invention. Specific embodiments are described below in order to facilitate an understanding of the general principles of the present invention. However, the principles of the present invention are not intended to be limited to these embodiments. Various modifications and variations will be apparent to one skilled in the art after having reviewed this disclosure.

Figure 4:
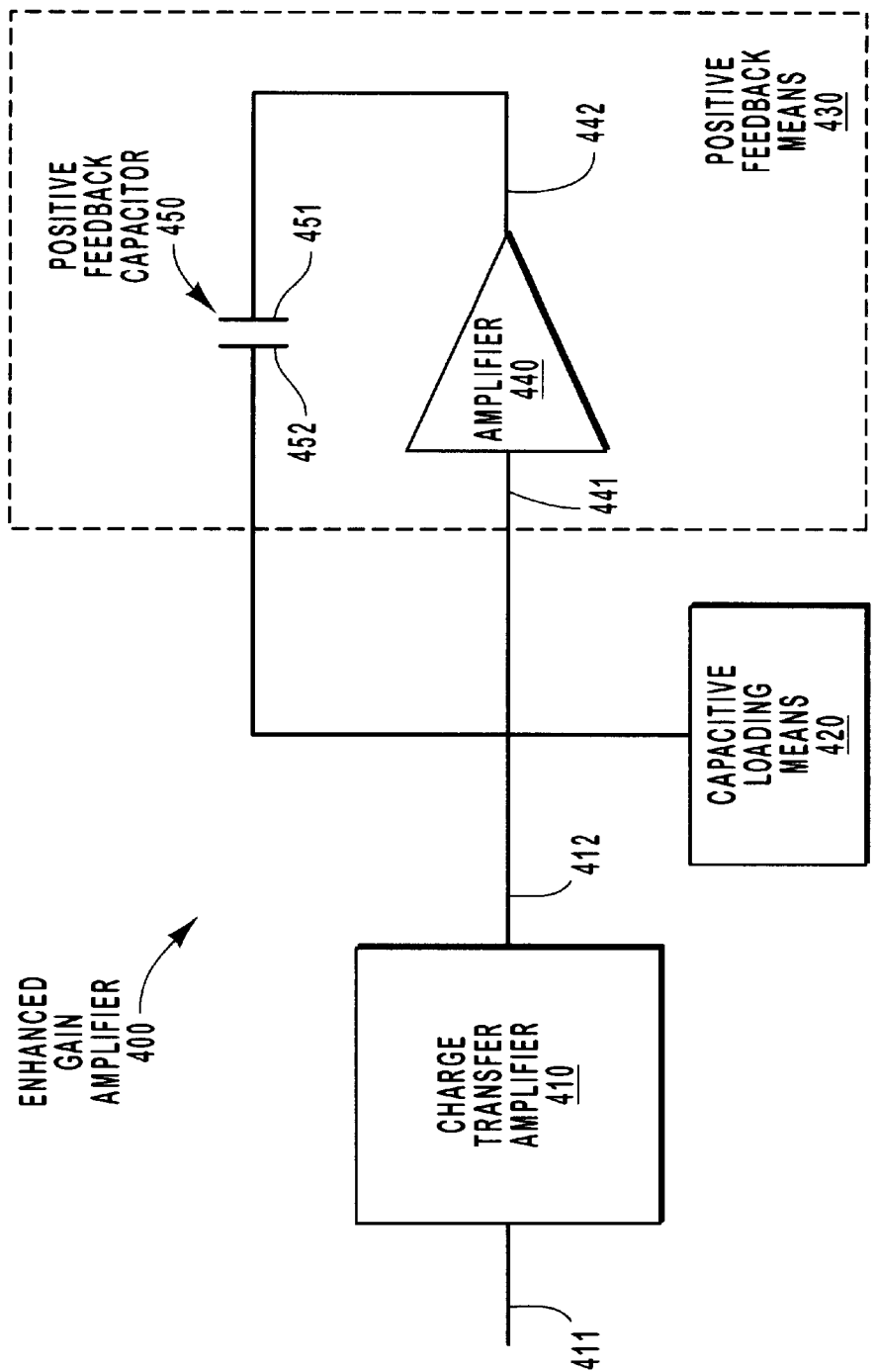
FIG. 4 is a broad schematic diagram of an enhanced gain amplifier that uses positive capacitive feedback in accordance with the present invention.

FIG. 4 illustrates an overall schematic diagram of an enhanced gain charge transfer amplifier 400 in accordance with the present invention. The enhanced gain amplifier includes a charge transfer amplifier 410 represented schematically by a box in FIG. 4. The charge transfer amplifier 410 includes at least one input terminal 411 and at least one output terminal 412. A capacitive loading means 420 is coupled to the output terminal 412 of the charge transfer amplifier 410. Additional, a positive feedback means 430 is also coupled to the capacitive loading means 420 so as to reduce the capacitance of the capacitive loading means 420.

Figure 5:
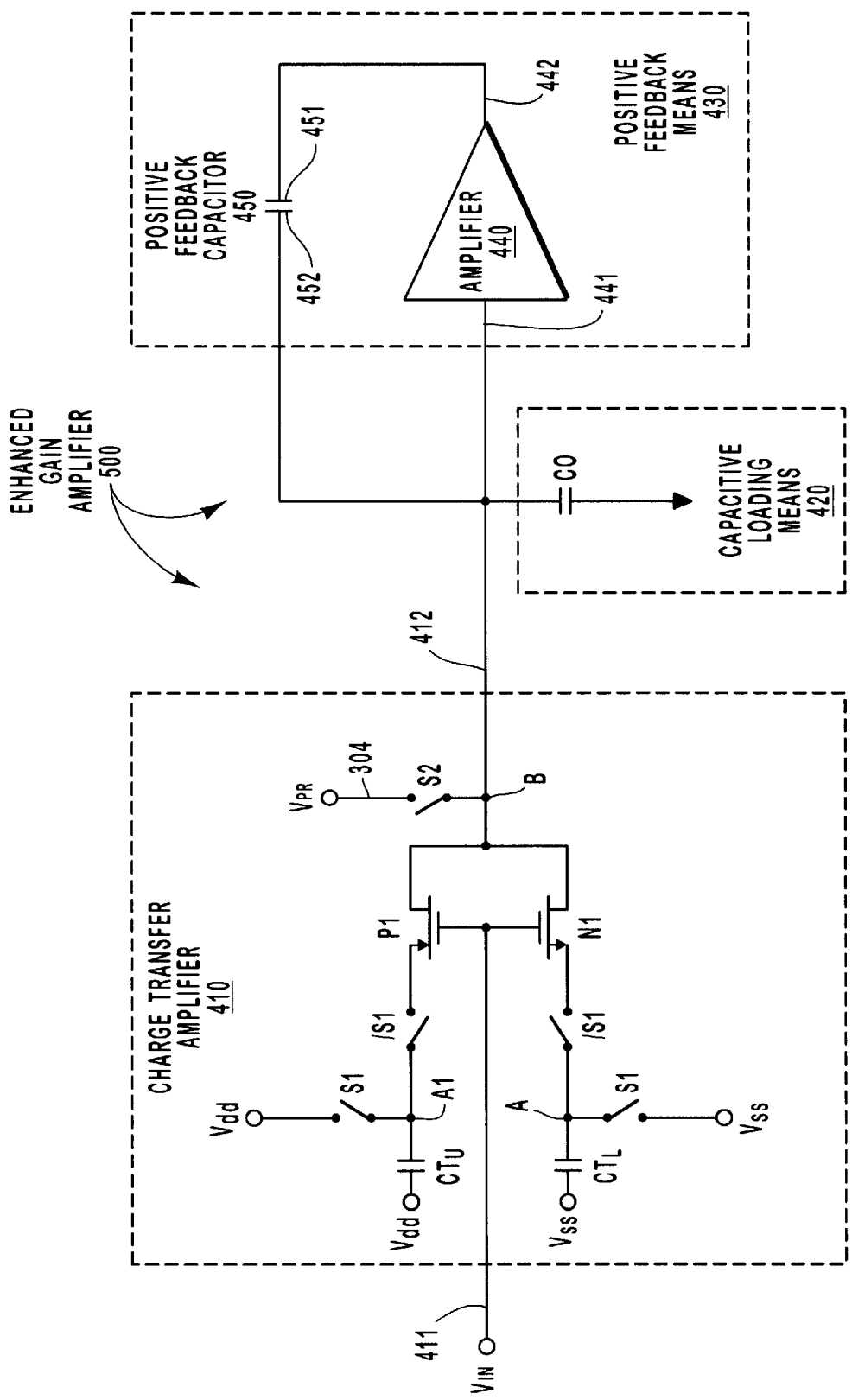
FIG. 5 illustrates in detail an embodiment of the enhanced gain amplifier of FIG. 4 in which the charge transfer amplifier is a conventional CMOS charge transfer amplifier.

Components of a positive feedback means 430 that accomplish this reduction in the capacitance of the capacitive loading means include an amplifier 440 having an input terminal 441 coupled to the output terminal 412 of the charge transfer amplifier 410. The positive feedback means 430 also includes a positive feedback capacitor 450 having one terminal 451 connected to the output terminal 442 of the amplifier 430 and a second terminal 452 connected to the output terminal 412 of the charge transfer amplifier 410 and to the capacitive loading means 420. FIG. 5 illustrates an enhanced gain amplifier 500 that corresponding to FIG. 4 in which the charge transfer amplifier 410 is a conventional CMOS charge transfer amplifier of the variety described with respect to FIG. 3 and in which the capacitive loading means 420 includes the output capacitor CO of the charge transfer amplifier having one terminal coupled to a fixed voltage and another terminal coupled to the output terminal 412 of the charge transfer amplifier 410.

Figure 3:
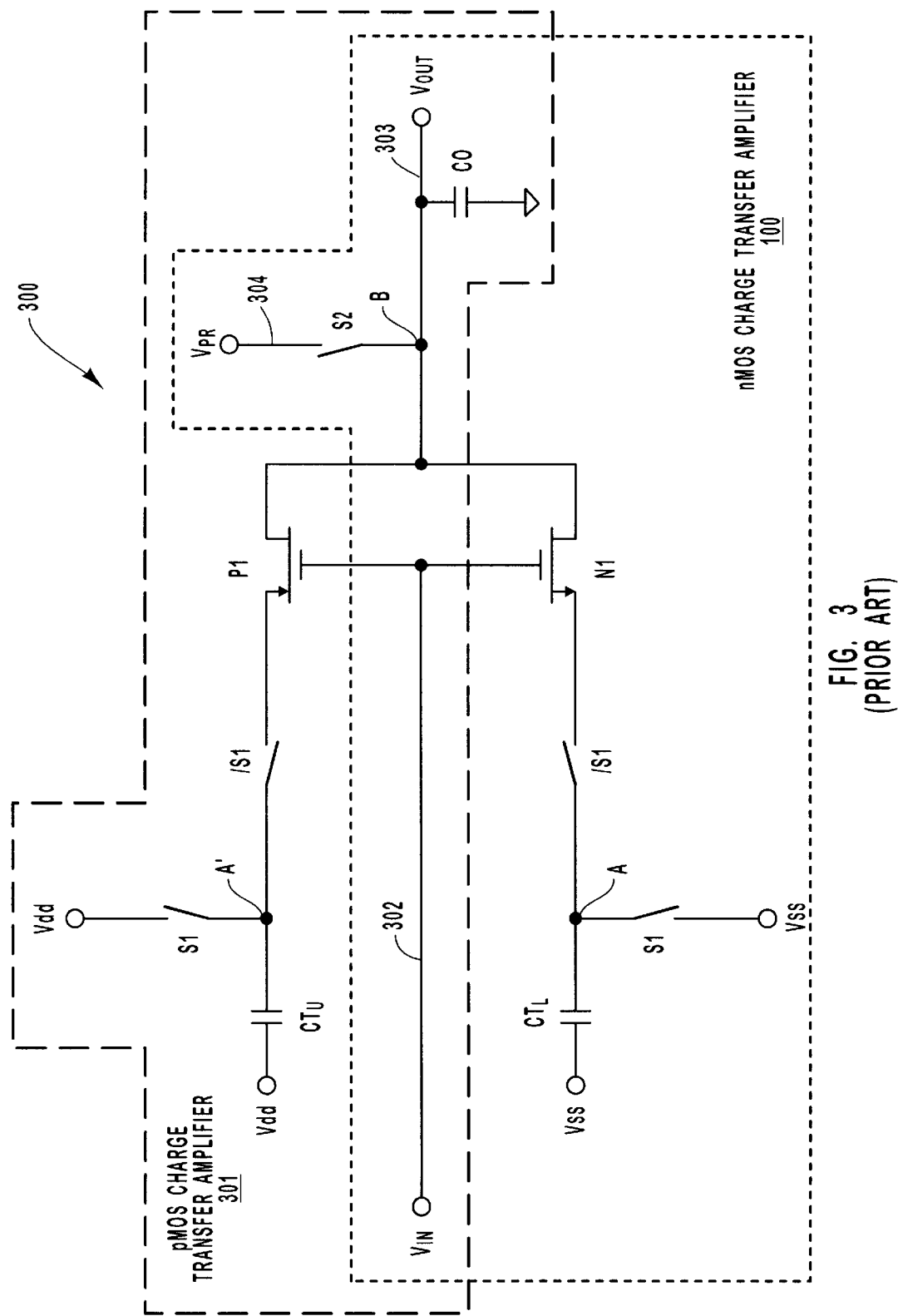
FIG. 3 is a circuit diagram of a conventional CMOS charge transfer amplifier which can amplify positive and negative changes in the input voltage.

As described above with respect to the conventional CMOS charge transfer amplifier of FIG. 3, without the positive feedback means 430, a voltage change of $\Delta V_{IN}$ at the input terminal 411 of the charge transfer amplifier 410 will result in an amplified voltage change of $\Delta V_{IN} \times (CT/CO)$, where "CT" is the capacitance of the capacitor $CT_L$ for positive input voltage changes $\Delta V_{IN}$, where "CT" is the capacitance of the capacitor $CT_U$ for negative input voltage change $\Delta V_{IN}$, and where CO is the capacitance of the capacitor CO. The lower the output capacitance CO, the greater the gain of the charge transfer amplifier 410.

The positive feedback means 430 has the effect of reducing the apparent output capacitance at the output terminal 412 of the charge transfer amplifier 410. Thus, the gain of the charge transfer amplifier is increased as compared to not having the positive feedback means 430.

Figure 2:
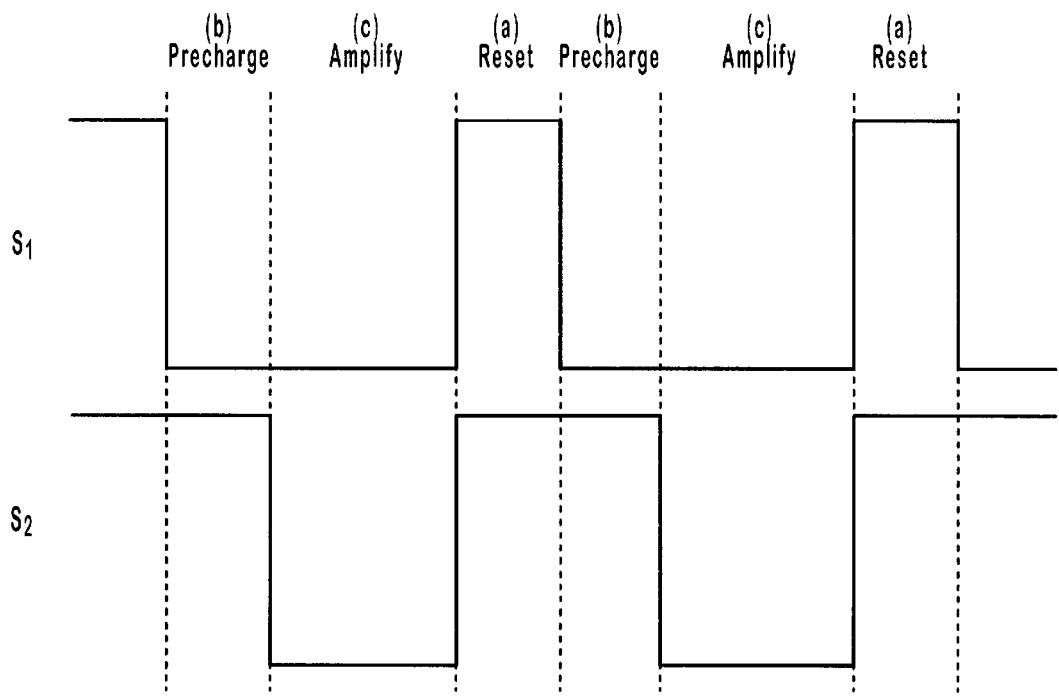
FIG. 2 is a timing diagram of several waveforms used to operate switches S1 and S2 in order to properly operate the nMOS charge transfer amplifier of FIG. 1, and the CMOS charge transfer amplifier of FIG. 3.
Figure 6:
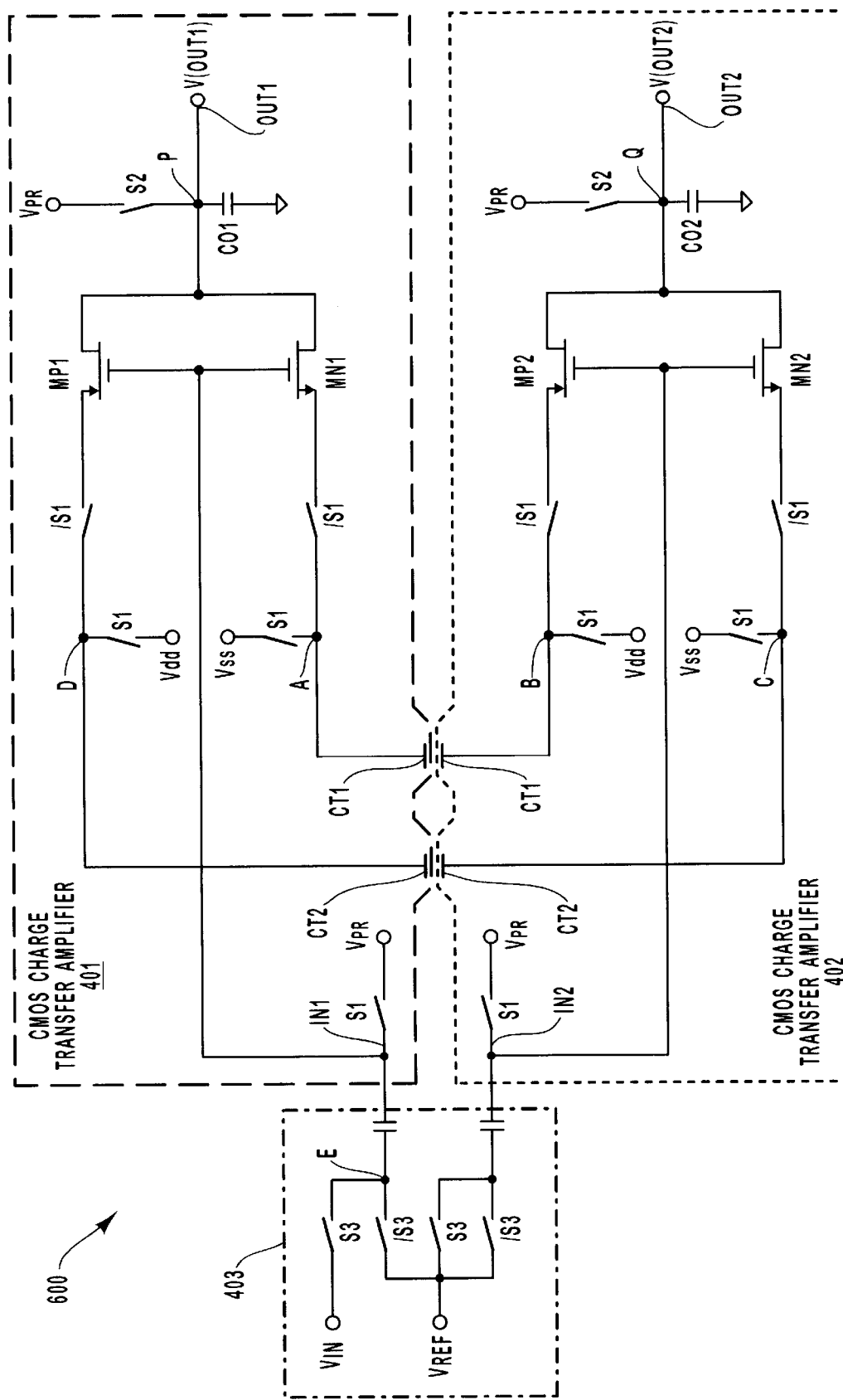
FIG. 6 illustrates a differential mode charge transfer amplifier.

The charge transfer amplifier 410 may also be a differential mode charge transfer amplifier of the kind described in co-pending U.S. patent application Ser. No. 09/1451,562, filed Nov. 30, 1999, which is incorporated herein by reference in its entirety. FIG. 6 illustrates a differential mode charge transfer amplifier 600. In summary, the differential mode charge transfer amplifier uses the signal waveforms of FIG. 2 to perform differential mode amplification in which an input differential voltage ($V_{IN}-V_{REF}$) is used to produce an amplifier differential voltage between the two output terminals (i.e., node P and node Q). The detailed operation and other advantages of the differential mode charge transfer amplifier are described in U.S. patent application Ser. No. 09/451,562, previously incorporated by reference.

Figure 7:
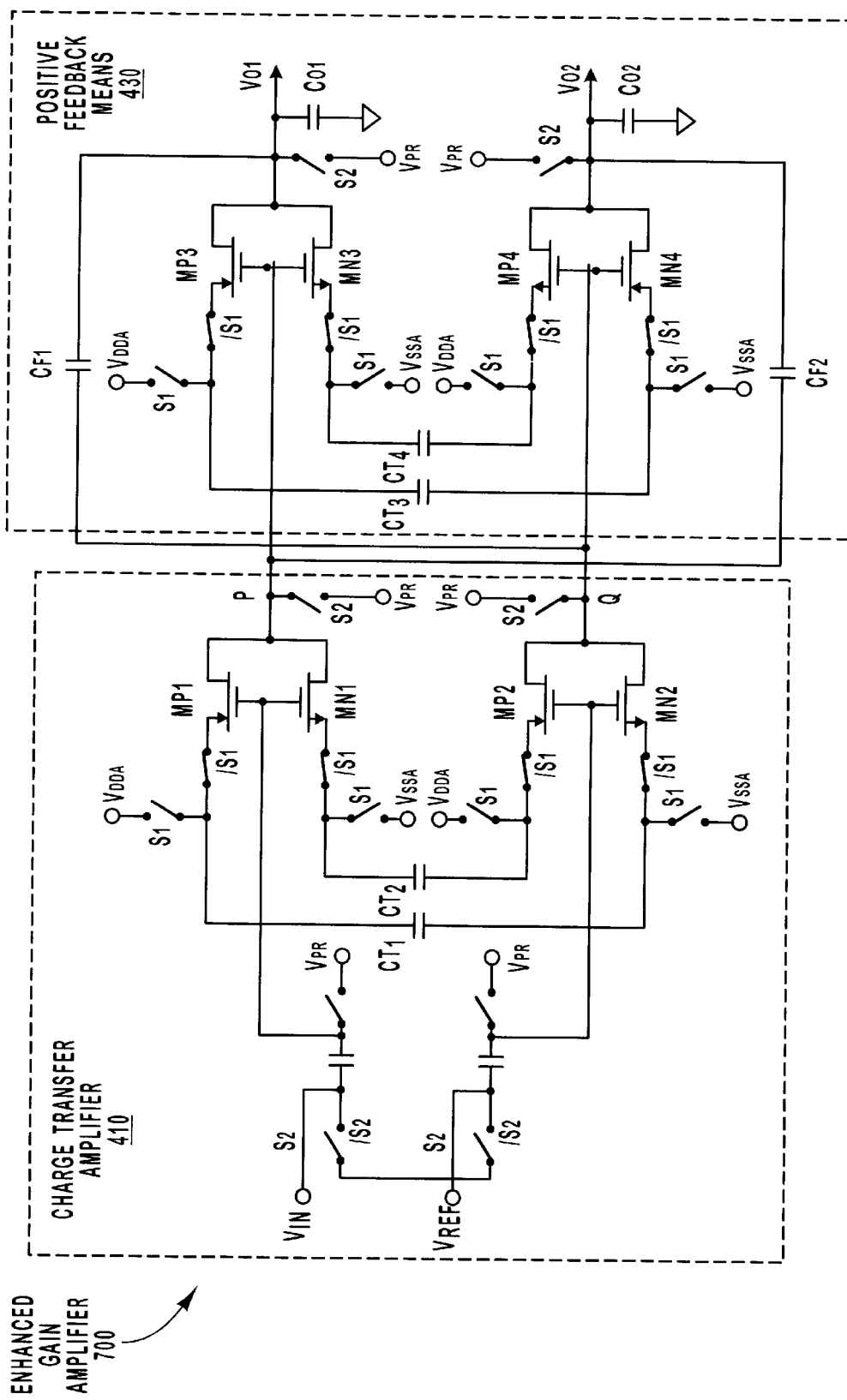
FIG. 7 illustrate in detail an embodiment of the enhanced gain amplifier of FIG. 4 in which the charge transfer amplifier is a different mode charge transfer amplifier and in which the second stage amplifier is a differential mode charge transfer amplifier.

FIG. 7 illustrates an enhanced gain amplifier 700 in which the charge transfer amplifier 410 is a differential mode charge transfer amplifier. Note, however, that although the differential mode charge transfer amplifier may include a capacitive loading means 420 in the form of an actual capacitor coupling each of the output terminals to a fixed voltage, these capacitors are lacking in the charge transfer amplifier 410. For example, referring to the differential mode charge transfer amplifier illustrated in FIG. 6, a capacitor CO1 couples one output terminal (node P) to a fixed voltage while a capacitor CO2 couples the other output terminal (node Q) to a fixed voltage. The capacitive load means 420 may include these capacitors CO1 and CO2 configured as shown in FIG. 6. However, the capacitive loading means 420 in FIG. 7 is the inherent gate capacitance at the transistors MP3 and MN3 for the first output terminal (node P) and the inherent gate capacitance at the transistors MP4 and MN4 for the second output terminal (node Q). By eliminating the capacitors CO1 and CO2, the overall amplifier size may be reduced.

The positive feedback means 430 of the enhanced gain amplifier includes a second stage differential mode charge transfer amplifier. The second stage differential mode charge transfer amplifier is modified as compared to the differential mode charge transfer amplifier shown in FIG. 6 in that the input coupling portion 403 is removed. The input coupling 403 is important to the operation of the differential mode charge transfer amplifier 600 shown in FIG. 6 as it ensures good common mode range and accurate differential mode signal coupling. However, in the enhanced gain amplifier 700 of FIG. 7, the input terminals of the second stage differential mode charge transfer amplifier are precharged to the same voltage as the output terminals of the first stage differential mode charge transfer amplification. Thus, input coupling is not needed in the second stage in order to ensure good common mode range and accurate differential mode signal coupling. The removal of the input coupling portion from the second stage amplifier reduces the size of the enhanced gain amplifier 700 as compared to including the input coupling. However, the second stage differential mode charge transfer amplifier may include the input coupling as desired. If included, the input terminals of the second stage differential mode charge transfer amplifier, may or may not, be precharged to the same voltage as the output terminals of the first stage differential mode charge transfer amplifier.

The positive feedback means 430 includes a positive feedback capacitor CF1 capacitively coupling an output terminal of the second stage differential mode charge transfer amplifier to a first output terminal of the first stage differential mode charge transfer amplifier thereby reducing the apparent capacitance at the first output terminal of the first stage differential mode charge transfer amplifier. In addition, another positive feedback capacitor CF2 capacitively couples the other output terminal of the second stage differential mode charge transfer amplifier to the second output terminal of the first stage differential mode charge transfer amplifier thereby reducing the apparent capacitance at the second output terminal of the first stage differential mode charge transfer amplifier.

The reduction in capacitance at the output terminals of the first stage differential mode charge transfer amplifier increases the gain of the first stage differential mode charge transfer amplifier. This increase gain is again magnified with the second stage differential mode charge transfer amplifier to produce an even larger gain at the output nodes of the second stage differential mode charge transfer amplifier thereby producing a differential output voltage of VO1–VO2.

In operation, at a given sampling rate, the feedback capacitors CF1 and CF2 will cause the first stage differential mode charge transfer amplifier to exhibit a reduced gain due to the increased load capacitance at nodes P and Q. However, as the enhanced gain amplifier 700 proceeds further into the amplify phase of the cycle, the positive feedback capacitors CF1 and CF2 will couple some of the output signal back to nodes P and Q thereby increasing the gain of the first stage differential mode charge transfer amplifier. The overall gain of the enhanced gain amplifier 700 will increase to more than that obtainable by simply cascading the first and second stage differential mode charge transfer amplifiers without positive capacitive feedback.

Figure 8:
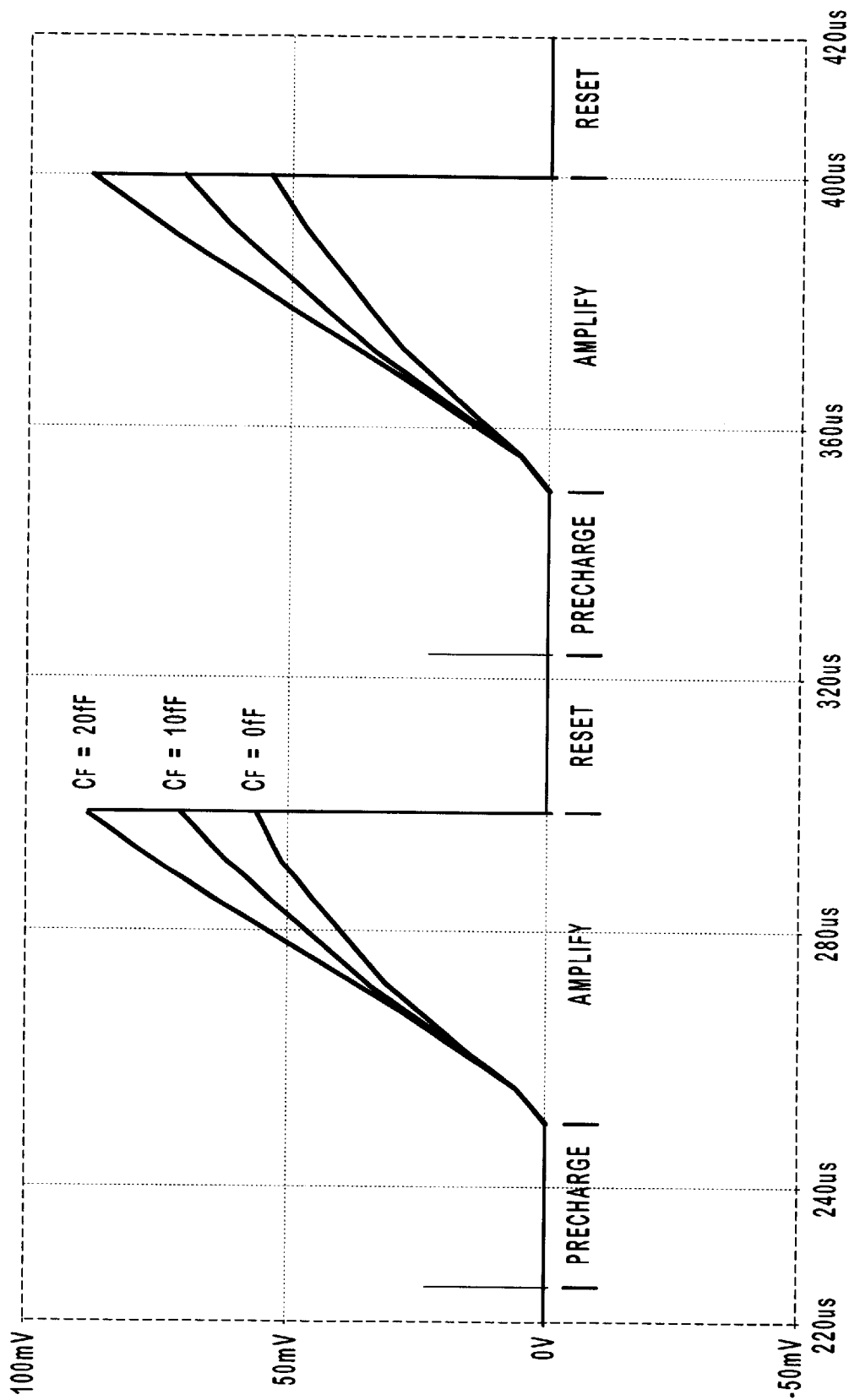
FIG. 8 illustrates simulated output of the circuit of FIG. 7 for a sampling rate of 10,000 samples per second for feedback capacitances of 0, 10 and 20 femtoFarads.
Figure 9:
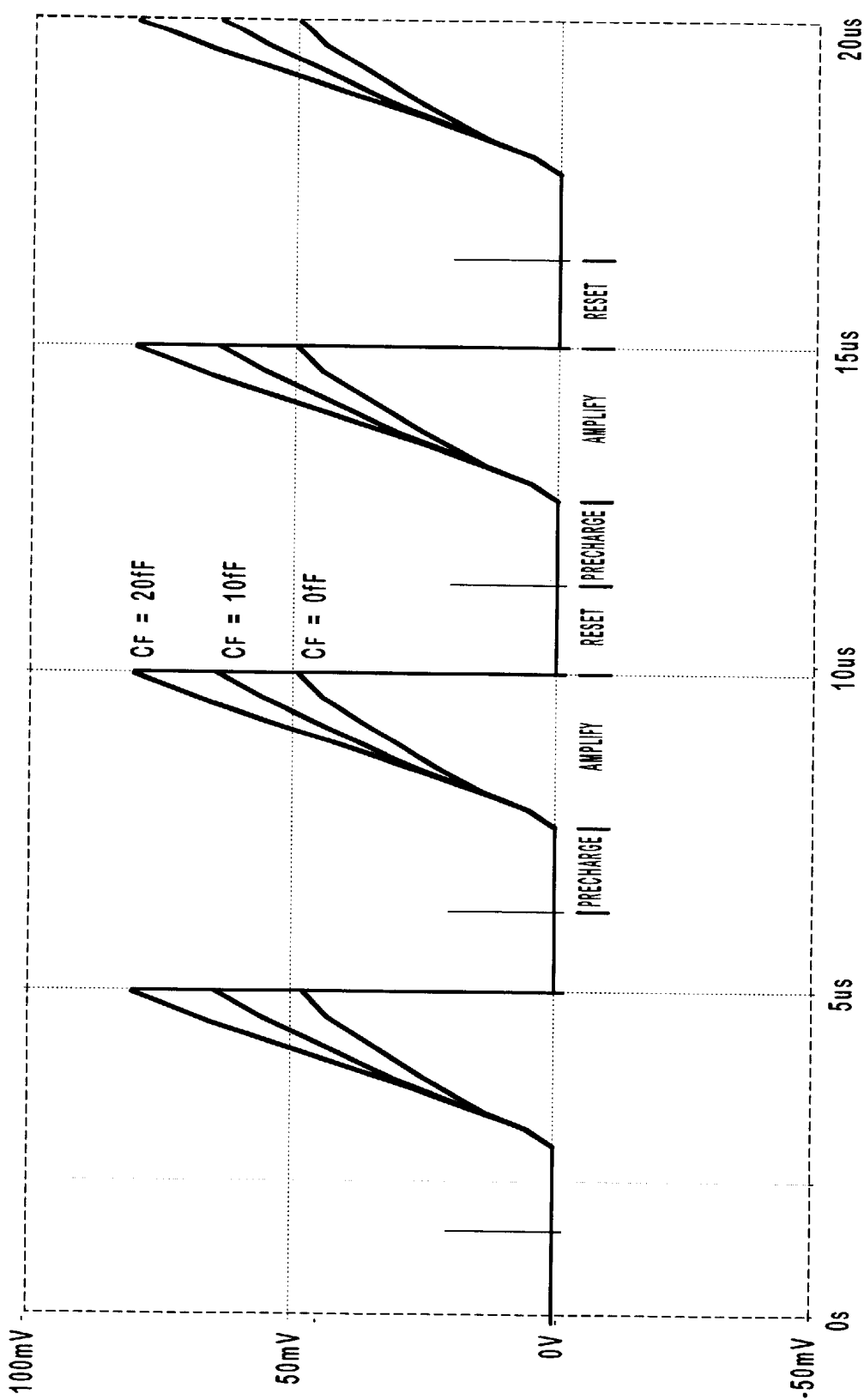
FIG. 9 illustrates simulated output of the circuit of FIG. 7 for a sample rate of 200,000 samples per second for feedback capacitances of 0, 10 and 20 femtoFarads.

FIG. 8 shows simulation results where the sample rate is 10,000 samples per second. The enhanced gain amplifier 700 is stimulated with a 10 milliVolt differential. The amplifier response in millivolts during the Amplify phase thus represents the gain of the enhanced gain amplifier 700. Simulation results are given for a feedback capacitance of 0 femtoFarads (fF), 10 fF and 20 fF. The results at 0 fF would represent no positive feedback capacitance. As apparent from FIG. 8, the gain is increased as the feedback capacitance increases. FIG. 9 shows simulation results where the sample rate is 200,000 samples per second. Increase amplifier gain is demonstrated at this sampling rate as well.

As demonstrated in FIGS. 8 and 9, for smaller feedback capacitances, the overall gain increases the larger the feedback capacitance. However, if feedback capacitances are too large, the gain of the second stage amplifier tends to degrade towards zero thereby reducing the overall gain of the enhanced gain amplifier. Thus, the feedback capacitances should not be so large as to significantly degrade the gain in the overall system.

In one embodiment of the invention, the feedback capacitor CF1 is structured similar to the transistors MN4 and MP4 while the feedback capacitor CF2 is structure similar to the transistors MN3 and MP3. The similarity in structure allows for the gate capacitance across MN3 and MP3 (and MN4 and MP4) to change proportionally with the capacitance of the corresponding feedback capacitor CF2 (and CF1) with large variation in temperature, bias conditions and threshold voltages.

Figure 10A:
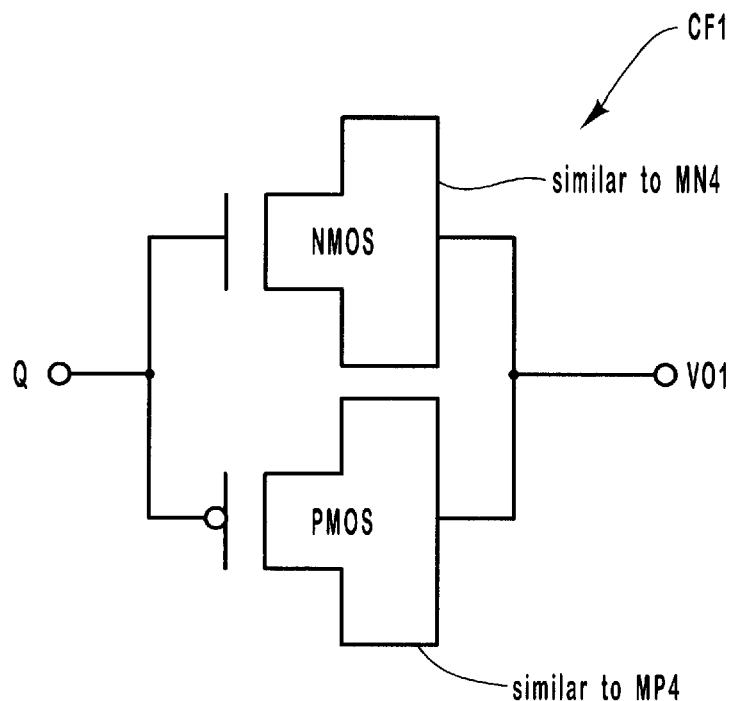
FIG. 10A illustrates in more detail the structure of a feedback capacitor CF1 of FIG. 7.
Figure 10B:
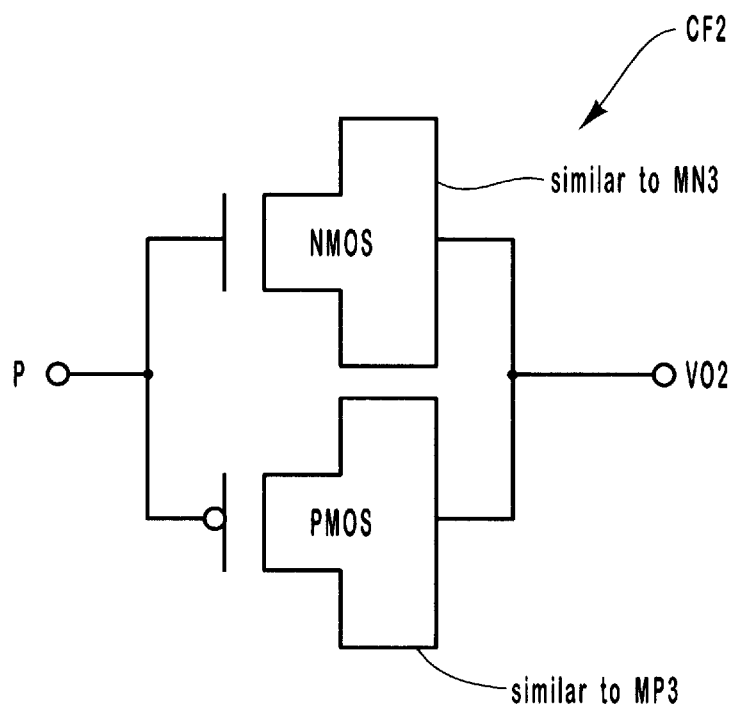
FIG. 10B illustrates in more detail the structure of a feedback capacitor CF2 of FIG. 7.

FIG. 10A illustrates in detail the preferred structure of the feedback capacitor CF1. The feedback capacitor exists between node Q and node VO1. The feedback capacitor CF1 includes a non-operational nMOS transistor which is structured similar to transistor MN4, and a non-operational pMOS transistor which is structure similar to transistor MP4. The gates of each of the nMOS and pMOS transistors are coupled to node Q forming one terminal of the capacitor CF1 just as the gates of the transistors MP4 and MN4 form one terminal of an inherent gate capacitor coupled to the node Q. The body regions of the nMOS and pMOS transistors are coupled to the output terminal VO1 forming the other terminal of the feedback capacitor CF1. The dimensions of the nMOS and pMOS transistors in the feedback capacitor CF1 are preferably in proportion to the dimensions of the transistors MN4 and MP4 in the second stage differential mode charge transfer amplifier. Due to this similar parallel structure, the capacitive behavior of the feedback capacitor CF1 will change proportionally with the capacitive behavior of the inherent capacitor formed by transistors MN4 and MP4. Therefore, the performance of the enhanced mode amplifier 700 will be consistent across a wide range of temperatures, bias conditions, and threshold voltages. FIG. 10B shows a preferred structure of the second feedback capacitor CF2 which is similar to the structure of FIG. 10A except that the nMOS transistor is similar in structure to the transistor MN3 while the pMOS transistor is similar in structure to the transistor MP3.

The present invention maybe embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. An enhanced gain amplifier comprising the following:
    a first stage charge transfer amplifier having at least one input terminal and at least one output terminal;
    a capacitive loading means coupled to the at least one output terminal of the first stage charge transfer amplifier; and
    a positive feedback means coupled back to the capacitive loading means so as to reduce the capacitance of the capacitive loading means.

2. The enhanced gain amplifier in accordance with claim 1, wherein the positive feedback means comprises the following:
    a second stage amplifier having an input terminal connected to an output terminal of the first stage charge transfer amplifier; and
    a feedback capacitor having a first terminal connected to an output terminal of the amplifier and a second terminal connected to the output terminal of the first stage charge transfer amplifier.

3. The enhanced gain amplifier in accordance with claim 2, wherein the capacitive loading means comprises transistors included as part of the amplifier.

4. The enhanced gain amplifier in accordance with claim 2, wherein the first stage charge transfer amplifier comprises a differential mode charge transfer amplifier.

5. The enhanced gain amplifier in accordance with claim 4, wherein the second stage amplifier also comprises at least a portion of a differential mode charge transfer amplifier.

6. The enhanced gain amplifier in accordance with claim 5, wherein the portion of the differential mode charge transfer amplifier excludes an input coupling portion.

7. The enhanced gain amplifier in accordance with claim 5, wherein the portion of the differential mode charge transfer amplifier includes an input coupling portion.

8. The enhanced gain amplifier in accordance with claim 1, wherein the capacitive loading means comprises a capacitor capacitively coupling the output terminal of the first stage charge transfer amplifier to a fixed voltage.

9. The enhanced gain amplifier in accordance with claim 1, wherein the first stage charge transfer amplifier comprises a differential mode change transfer amplifier.

10. An enhanced gain amplifier comprising the following:
    a first stage differential mode charge transfer amplifier having first and second input terminals and first and second output terminals;
    a second stage differential mode charge transfer amplifier having first and second input terminals and first and second output terminals,
    wherein the first and second input terminals of the second stage differential mode charge transfer amplifier are respectively coupled to the first and second output terminals of the first stage differential mode charge transfer amplifier,
    wherein the first output terminal of the second stage differential mode charge transfer amplifier is capacitively coupled to the second output terminal of the first stage differential mode charge transfer amplifier, and
    wherein the second output terminal of the second stage differential mode charge transfer amplifier is capacitively coupled to the first output terminal of the first stage differential mode charge transfer amplifier.

11. The enhanced gain amplifier in accordance with claim 10, wherein the second stage differential mode charge transfer amplifier lacks an input coupling portion.

12. The enhanced gain amplifier in accordance with claim 10, wherein the first output terminal of the second stage differential mode charge transfer amplifier is capacitively coupled to the second output terminal of the first stage differential mode charge transfer amplifier though a feedback capacitor, wherein the feedback capacitor has similar capacitive properties to gate capacitances of transistors existing within the second stage differential mode charge transfer amplifier.

13. The enhanced gain amplifier in accordance with claim 12, wherein
the second output terminal of the first stage differential mode charge transfer amplifier is coupled to a gate of a first nMOS transistor and a gate of a first pMOS transistor within the second stage differential mode charge transfer amplifier,
the second output terminal of the second stage differential mode charge transfer is coupled to the source or drain terminal of both the first nMOS transistor and the first pMOS transistor;
the feedback capacitor comprises:
a second nMOS transistor that is structure similar to the first nMOS transistor, the gate of the second nMOS transistor coupled to the second output terminal of the first stage differential mode charge transfer amplifier, the body of the second nMOS transistor coupled to the first output terminal of the second stage differential mode charge transfer amplifier;
a second pMOS transistor that is structure similar to the first pMOS transistor, the gate of the second pMOS transistor coupled to the second output terminal of the first stage differential mode charge transfer amplifier, the body of the second pMOS transistor coupled to the first output terminal of the second stage differential mode charge transfer amplifier.

14. The enhanced gain amplifier in accordance with claim 13, wherein the feedback capacitor is a first feedback capacitor, wherein the second output terminal of the second stage differential mode charge transfer amplifier is capacitively coupled to the first output terminal of the first stage differential mode charge transfer amplifier through a second feedback capacitor, wherein the second feedback capacitor has similar capacitive properties to gate capacitances of transistors existing the second stage differential mode charge transfer amplifier.

15. The enhanced gain amplifier in accordance with claim 14, wherein
the first output terminal of the first stage differential mode charge transfer amplifier is coupled to a gate of a third nMOS transistor and a gate of a third pMOS transistor within the second stage differential mode charge transfer amplifier,
the first output terminal of the second stage differential mode charge transfer is coupled to the source or drain terminal of both the third nMOS transistor and the third pMOS transistor;
the feedback capacitor comprises:
a fourth nMOS transistor that is structured similar to the third nMOS transistor, the gate of the fourth nMOS transistor coupled to the first output terminal of the first stage differential mode charge transfer amplifier, the body of the fourth nMOS transistor coupled to the second output terminal of the second stage differential mode charge transfer amplifier;
a fourth pMOS transistor that is structured similar to the third pMOS transistor, the gate of the fourth pMOS transistor coupled to the first output terminal of the first stage differential mode charge transfer amplifier, the body of the fourth pMOS transistor coupled to the second output terminal of the second stage differential mode charge transfer amplifier.

16. In an amplifier that includes a first stage differential mode charge transfer amplifier and a second stage differential mode charge transfer amplifier cascaded with the first stage charge transfer amplifier so that the input terminals of the second stage differential mode charge transfer amplifier are coupled to the output terminals of the first stage differential mode charge transfer amplifier, a method of enhancing the gain of the amplifier comprising the following:
capacitively coupling a first output terminal of the second stage differential mode charge transfer amplifier to a first output terminal of the first stage differential mode charge transfer amplifier using a first feedback capacitor; and
capacitively coupling the second output terminal of the second stage differential mode charge transfer amplifier to a second output terminal of the first stage differential mode charge transfer amplifier using a second feedback capacitor.

17. The method in accordance with claim 16, where the second stage differential mode charge transfer amplifier lacks an input coupling portion.

18. The method in accordance with claim 16, further comprising:
structuring the first and second feedback capacitors to have similar capacitive properties to gate capacitances of transistors existing within the second stage differential mode charge transfer amplifier.

* * * * *

UNITED STATES PATENT AND TRADEMARK OFFICE
CERTIFICATE OF CORRECTION

Figure 1:
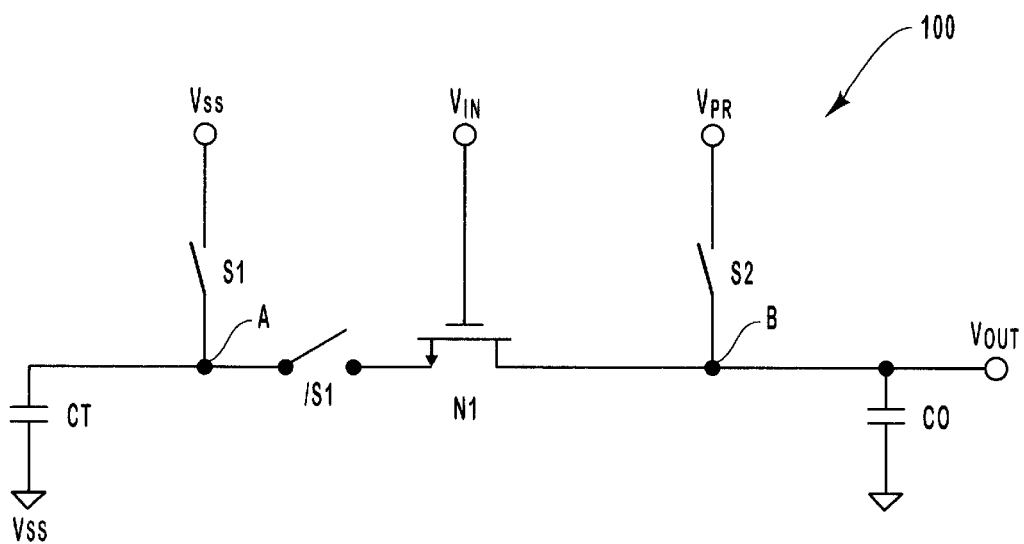
FIG. 1 is a circuit diagram of a conventional nMOS charge transfer amplifier.

PATENT NO.     : 6,356,148 B1
DATED          : March 12, 2002
INVENTOR(S)    : William J. Marble It is certified that error appears in the above-identified patent and that said Letters Patent is hereby corrected as shown below:

Drawings,
Fig. 1 (Prior Art): change "/S1" to -- !S1 --

Column 1,
Line 48, before "The open" change "$V_{PR}$." to -- $V_{PR}$). --

Column 2,
Line 23, after "consumption" change "maybe" to -- may be --
Line 67, after "$\Delta V_{IN}$" insert a period Column 3,
Line 66, before "learned" change "maybe" to -- may be --

Column 5,
Line 16, before "FIG. 5" start a new paragraph
Line 44, after "Ser. No." change "09/1451,562," to -- 09/451,562, --

Column 7,
Line 60, before "embodied" change "maybe" to -- may be --

Column 8,
Line 44, after "mode" change "change" to -- charge --

Signed and Sealed this

Twenty-sixth Day of November, 2002

*Attest:*

JAMES E. ROGAN
*Attesting Officer*         *Director of the United States Patent and Trademark Office*